United States Patent [19]

Dressen

[11] Patent Number: 5,348,151
[45] Date of Patent: Sep. 20, 1994

[54] LOW PROFILE DISK CARRIER

[75] Inventor: Larry G. Dressen, Waconia, Minn.

[73] Assignee: Empak, Inc., Chanhassen, Minn.

[21] Appl. No.: 170,389

[22] Filed: Dec. 20, 1993

[51] Int. Cl.$^5$ ............................................. B65D 85/30
[52] U.S. Cl. .................... 206/334; 206/454; 211/41; 118/500
[58] Field of Search .............. 206/328, 334, 454, 564; 211/41; 118/500

[56] References Cited

U.S. PATENT DOCUMENTS

| | | | |
|---|---|---|---|
| 3,923,156 | 12/1975 | Wallestad | 118/500 |
| 4,160,504 | 7/1979 | Kudlich et al. | 206/454 |
| 4,555,024 | 11/1985 | Voss et al. | 206/454 |
| 4,566,839 | 1/1986 | Butler | 118/500 |
| 4,573,851 | 3/1986 | Butler | 211/41 |
| 4,669,612 | 6/1987 | Mortensen | 206/334 |
| 4,981,222 | 1/1991 | Lee | 206/454 |

Primary Examiner—Steven N. Meyers
Assistant Examiner—Marie Denise Patterson
Attorney, Agent, or Firm—Haugen and Nikolai

[57] ABSTRACT

A low profile carrier for holding a plurality of memory disks during processing of the disks is described. The carrier is capable of securely holding disks of different thicknesses and is designed so that the disks are not damaged during insertion or removal of the disks from the carrier.

6 Claims, 3 Drawing Sheets

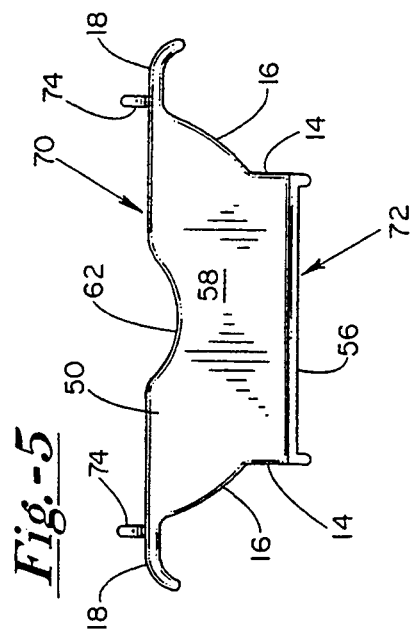
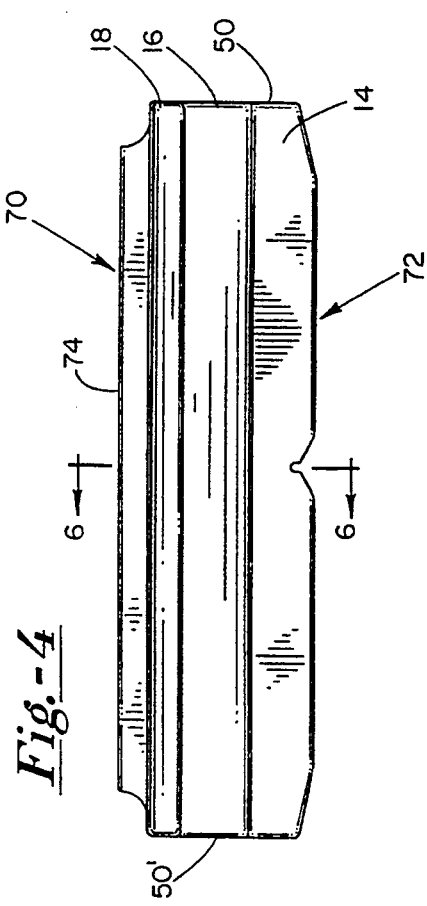
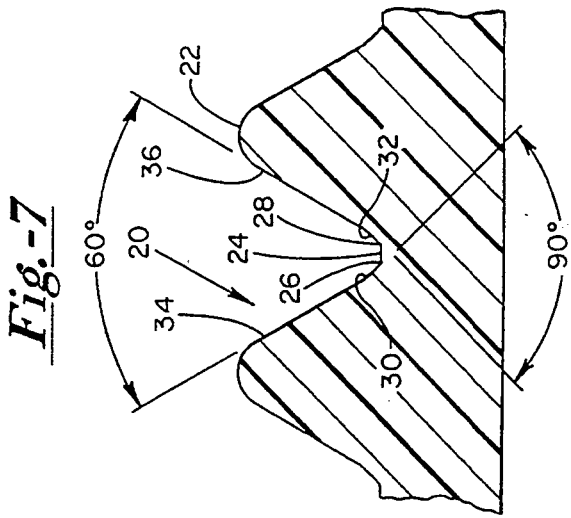
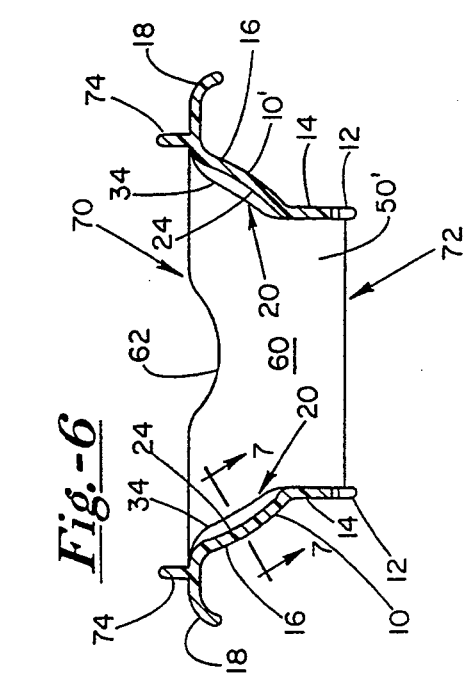

LOW PROFILE DISK CARRIER

BACKGROUND OF THE INVENTION

I. Field of the Invention

The present invention relates to a disk carrier for processing memory disks. More specifically, it relates to a low profile disk carrier having a plurality of disk dividers, each of which are geometrically configured to accommodate and hold either thin disks (0.032 of an inch thick) or relatively thick disks (0.050 of an inch thick).

II. Description of the Prior Art

Prior art disk carriers have traditionally been unable to hold both thin and thick disks. Also, prior art carriers were generally taller. Thus, as disks were inserted or removed from the cassette, the disks, at their peripheral edges, could become damaged as the peripheral edges scrape the side walls of the carrier. Contact to carrier side walls also causes particulation of plastic on the disk.

The present invention overcomes the disadvantages of prior art carriers in several ways. First, by providing a lower profile and a unique and novel disk divider design, scraping of the edges of the disks as they are inserted into or removed from the carrier is virtually eliminated. Second, the unique design of the disk dividers permits a single carrier to hold either thin or thick type disks. In the past, separate carriers had to be used for disks of different thicknesses. Third, the unique design of the disk dividers results in full contact to the outside diameter of the disk so that disks of either the thick or thin variety are held firmly in place and do not move or tilt within the carrier.

SUMMARY OF THE INVENTION

The purpose of the present invention is to provide a low profile disk carrier for the processing of disk substrates used in the manufacture of data storage and memory devices. The manufacturing process for the disks, themselves, includes a variety of different steps. In some of these steps, the disks are subjected to temperatures in the range of 260° to 330° centigrade. In other steps, the substrates are sputtered with magnetic material. It is important that this magnetic material does not become scratched or contain particulation of plastic by the disk carrier during the manufacturing process. Further, the manufacturing process for the disks involves the use of robotic equipment so any disk carrier must be designed to accommodate the conveyors and robotic handling tools used during manufacture.

According to one embodiment of the present invention, there is provided a low profile cassette for processing of disks. The low profile cassette has opposing mirror image side walls, each including a base member, an outwardly canted disk supporting member, and a handle member. The outwardly canted disk supporting member includes a plurality of disk dividers, each comprising a disk supporting notch. The design of this notch is unique and novel and permits the disk carrier to be used with disks which are either 0.032 inch thick or 0.050 inch thick, the two thicknesses most typically used in the manufacture of data memory and storage media. It is important to note that this invention could also be used to carry disks of other thicknesses such as 0.025 inches thick as the disk industry changes. The design of the notches of the disk dividers also results in full contact between the outside diameter of the disk and the carrier to securely hold the disks in place as well as a profile which allows the disks to be inserted into and removed from the wafer carrier without scratching.

More specifically, the base of the notch is approximately 0.51 mm wide and radiused along its length to conform to the outside diameter of the disk. The notch also includes a pair of shorter wall segments projecting from opposite ends of the base at approximately a 90° angle with respect to each other. Extending from each shorter wall segment is a longer wall segment. The longer wall segments are aligned at a 60° angle with respect to each other.

In addition to the two side walls, the package includes a pair of opposing end walls. Each end wall has an indentation at its center. The purpose of this indentation is to permit an arbor to be inserted over the end of the carrier and through center openings in the disks so that the disks can be lifted out of the carrier. Another feature of the design intended to accommodate robotic handling is the provision of stops which project upwardly from each of the handle members so that neither human hands nor robotic gripping equipment comes into contact with the disks as the carrier is lifted. Ramps on the bottom outside edges of the carrier are provided so that the carrier can be slid over irregular surfaces on the assembly line during transport of the carrier and its contents.

One object of the present invention is to provide a low profile disk carrier which is capable of retaining either thick or thin disks.

Another object of the present invention is to provide a disk carrier which reduces the risk that the peripheral edges of such disks will be scratched or damaged during insertion or removal of the disks from the carrier.

Another significant aspect of the invention is to provide a disk carrier which has end walls designed to accommodate an arbor which runs through the center hole in the disks to lift the disks out of the carrier.

Still another object of the invention is to provide a disk carrier which can withstand temperatures up to at least 330° centigrade.

Still another object of the invention is to provide a disk carrier which includes stops and ramps to accommodate robotic handling and transport over a conveyor system.

These and other objects of the present invention will become more apparent and better understood by reference to the following detailed description when considered in connection with the accompanying drawings, in which like reference numerals designate like parts throughout the figures.

BRIEF DESCRIPTION OF THE DRAWINGS

FIG. 4 is a side elevational view of the wafer carrier.

FIG. 5 is an end view of the wafer carrier.

FIG. 6 is a cross section through line 6—6 in FIG. 4.

FIG. 7 is a cross section through one of the side walls of the disk carrier.

DESCRIPTION OF THE PREFERRED EMBODIMENT

Figure 1:
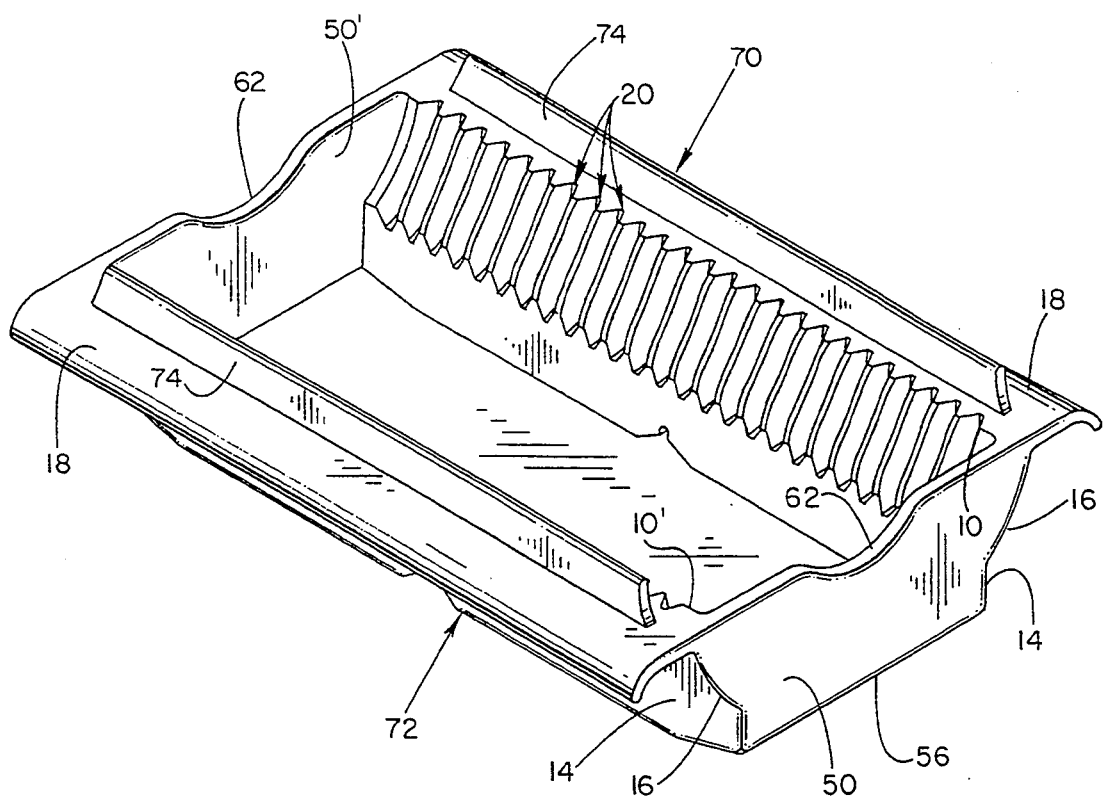
FIG. 1 is a perspective view of the disk carrier of the present invention.
Figure 2:
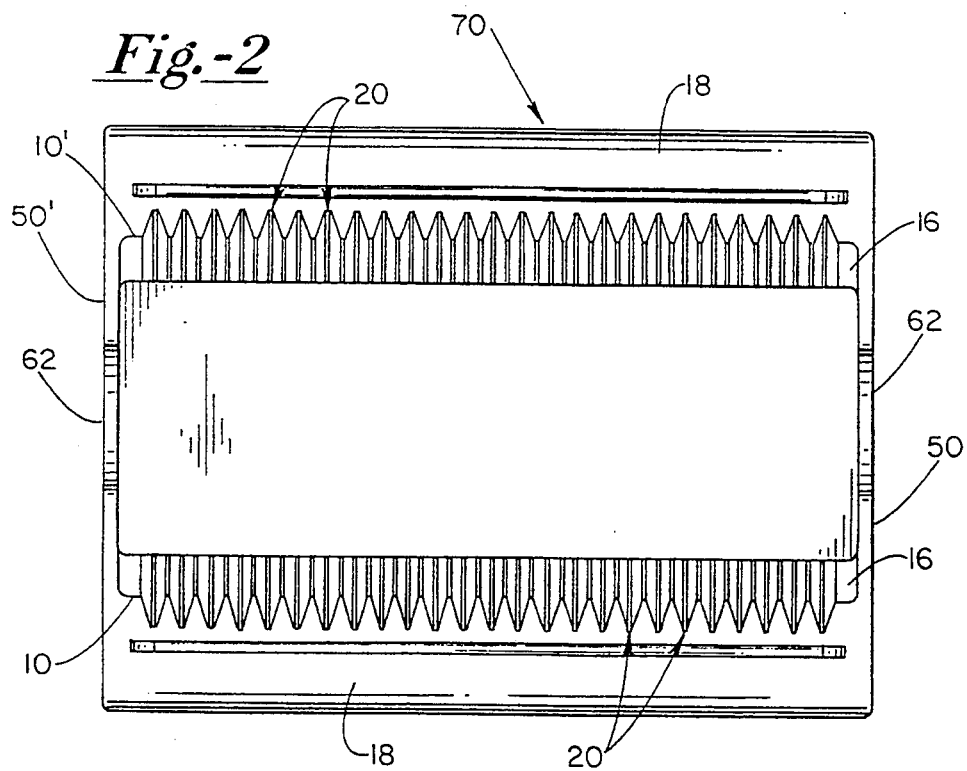
FIG. 2 is a top plan view of the disk carrier of the present invention.
Figure 3:
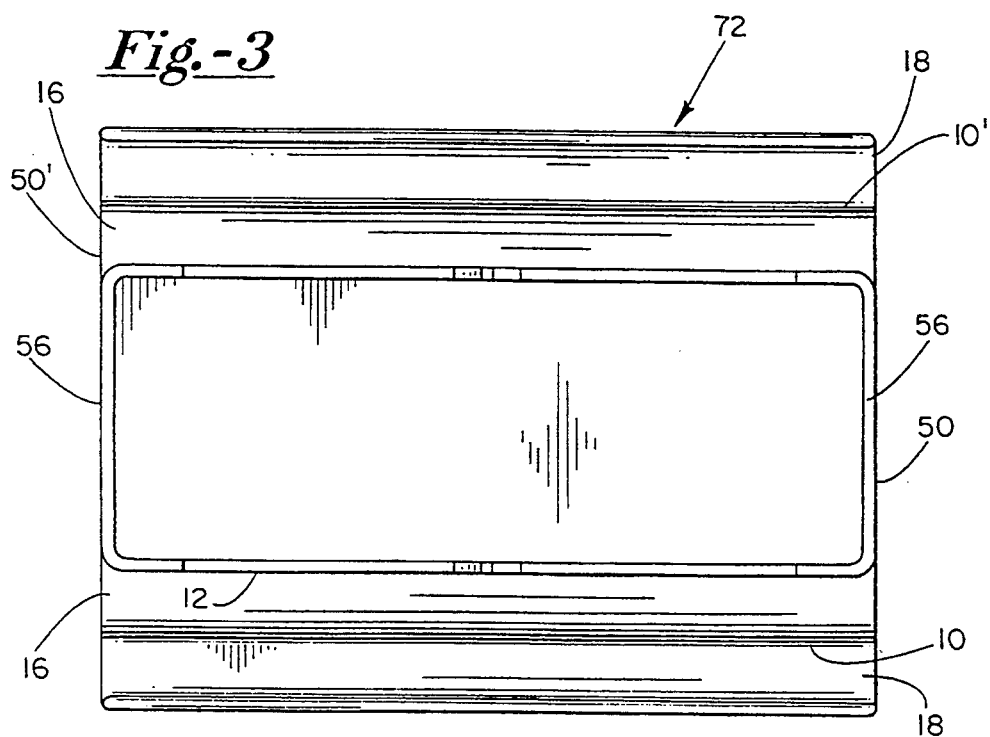
FIG. 3 is a bottom plan view of said disk carrier.

As shown in FIG. 1, the disk carrier of the present invention has a pair of side walls 10 and 101 and a pair of end walls 50 and 501. The top 70 is open as is the bottom 72. This arrangement allows the disks to be inserted and removed through the open top 70. Also, a tool (not shown) can be inserted through the bottom opening 72 to eject the disks from the carrier 10 through the open top 70.

As shown best in FIGS. 4 and 5, the carrier 10 has a very low profile. When 95 mm diameter disks are to be stored, the carrier 10 is built to have a maximum overall height of thirty-nine and one-half millimeters. This height will increase slightly if stops, such as 74 are added. The opening in bottom 72 is approximately seventy millimeters wide so that the ninety-five millimeter disk cannot pass through the bottom opening. The opening in top 70 is slightly wider than the diameter of the disk. The side walls 10 and 101 are tapered from a top dimension of slightly more than ninety-five millimeters to the seventy millimeter dimension of the opening in bottom 72. The manner in which this taper is provided is shown best in FIGS. 5 and 6.

The end walls 50 and 501 are the mirror image of each other. Each includes a raised bottom surface 56, and parallel flat sides 58 and 60. The edges of the end walls 50 and 501 conform to the shape of the side walls 10 and 101 so that the end walls and side walls form a single, integrally formed carrier. The top edge of each of the end walls 50 and 501 includes an indentation 62. Indentation 62 is positioned to provide access of an arbor past the end wall and into annular openings in the disks themselves.

FIG. 6 is a cross section of the carrier showing the profile of the side walls 10 and 101. The side walls include a foot member 12, a base member 14, an outwardly canted disk supporting member 16, and a handle member 18. Stops 74 can be added to project upwardly from the handle members 18. The disk supporting members 16 include a plurality of disk dividers 20, each comprising a disk supporting notch 22. The design of the notches 22 are such that the notches can be used either with thin (0.032 inch thick) disks or thick (0.050 inch thick) disks.

As shown in FIGS. 6 and 7, the base 24 of each notch is curved along its length. This curve is tooled to match the outside diameter of the disk to be supported in the notch. The base is approximately 0.51 mm wide and has opposing edges 26 and 28. Projecting from opposing edges 26 and 28 are short wall segments 30 and 32. These short wall segments project outwardly from edges 26 and 28 at approximately a 90° angle with respect to each other. The notches 22 also have longer wall segments 34 and 36 projecting from the shorter wall segments 30 and 32. Wall segments 34 and 36 reside at approximately a 60° angle with respect to each other.

When in use, a row of disks are inserted between the side walls 10 and 101 into the opposing notches 22. The opposing notches are aligned with each other. Either 0.050 or 0.032 inch thick disks can be held in the carrier given the design of the notches 22. The carrier can then be moved about using robotic equipment to lift the carrier by the handles or slide the equipment along a conveyor system. Ramps 80 are provided at each corner to permit the carrier to slide over irregularities in the conveyor system.

What is claimed is:

1. A low profile processing cassette for holding disks comprising:
    a. opposing mirror image side walls each including a base member, and outwardly canted disk supporting member, and a handle member, said outwardly canted disk supporting member having a plurality of disk dividers each comprising a disk supporting notch having a base curved along its length to conform to the outside diameter of the disk, a pair of shorter wall segments projecting from opposite edges of the base at approximately a 90° angle with respect to each other, and a pair of longer wall segments projecting from the ends of the shorter wall segments opposite the base at approximately a 60° angle with respect to each other; and
    b. a pair of opposing mirror image end walls.

2. The low profile processing cassette of claim 1 further including a stop projecting upwardly from the handle member.

3. The low profile processing cassette of claim 1 wherein the ends of the side walls, at the bottom are ramped upwardly to allow the cassette to slide over irregular surfaces during processing of the disks.

4. The low profile processing cassette of claim 1 wherein the end walls have an arbor receiving cut-out positioned to be aligned with annular openings through the center of the disks held in the processing cassette.

5. The low profile processing cassette of claim 1 wherein the height of the cassette is less than 53 mm.

6. The low profile processing cassette of claim 1 wherein said cassette is made of a material resistant to the effect of temperatures of at least 330° centigrade.

* * * * *